(12) United States Patent
Brooks et al.

(10) Patent No.: US 7,640,362 B2
(45) Date of Patent: Dec. 29, 2009

(54) ADAPTIVE COMPRESSION IN AN EDGE ROUTER

(75) Inventors: Leslie M. Brooks, West Melbourne, FL (US); Kevin L. Farley, Palm Bay, FL (US)

(73) Assignee: InterDigital Technology Corporation, Wilmington, DE (US)

( * ) Notice: Subject to any disclaimer, the term of this patent is extended or adjusted under 35 U.S.C. 154(b) by 704 days.

(21) Appl. No.: 09/774,545

(22) Filed: Jan. 31, 2001

(65) Prior Publication Data

US 2002/0103938 A1 Aug. 1, 2002

(51) Int. Cl.
G06F 15/16 (2006.01)
(52) U.S. Cl. ...................................... 709/247; 709/246
(58) Field of Classification Search .................. 709/247
See application file for complete search history.

(56) References Cited

U.S. PATENT DOCUMENTS

| | | | | |
|---|---|---|---|---|
| 5,146,221 A | * | 9/1992 | Whiting et al. | 709/247 |
| 5,153,591 A | | 10/1992 | Clark | 341/51 |
| 5,253,325 A | | 10/1993 | Clark | 395/2 |
| 5,555,377 A | * | 9/1996 | Christensen et al. | 709/247 |
| 5,838,927 A | * | 11/1998 | Gillon et al. | 709/247 |
| 6,055,502 A | * | 4/2000 | Kitamura | 704/500 |
| 6,615,275 B2 | * | 9/2003 | Yohe et al. | 709/247 |
| 2002/0078241 A1 | * | 6/2002 | Vidal et al. | 709/247 |

OTHER PUBLICATIONS

Information Describing Application Signaling Over Cellular Links: Internet-Draft, pp. 1-16; http//www-xsup.csx.cam.ac.uk/netdoc/internet-drafts/draft-hannu-rohc-signaling-cellular-00.txt (downloaded Nov. 2000).
Nelson, M., "LZW Data Compression," *Dr. Dobb's Journal* (Oct. 1989).

* cited by examiner

*Primary Examiner*—Hassan Phillips
(74) *Attorney, Agent, or Firm*—Volpe and Koenig, P.C.

(57) ABSTRACT

Compression efficiency is optimized by filtering protocol-specific header and control information of a protocol data unit (PDU) to determine compressibility of the contents of the protocol data unit. Based on the result of the filtering, the state of data link compression is selected for the protocol data unit in a manner optimizing compression efficiency. A filter performing the filtering may access a table having entries with specific media types deemed compression limited and associate individual PDUs to a specific media type. When associating the individual PDUs, the filter typically determines if a given PDU is associated with a previously filtered PDU and, if so, assigns the same state of data link compression for the given PDU as for the previously filtered PDU. The data link compression is disabled if the filter determines the compressibility of the contents of the PDU is determined to be low.

24 Claims, 19 Drawing Sheets

Compression Dictionary — 300

| | Pattern | Code | |
|---|---|---|---|
| 305 | I | 1 | (text) |
| 310 | THINK | 2 | (text) |
| 315 | SO | 3 | (text) |
| 320 | I THINK | 4 | (text) |
| 325 | THINK SO | 5 | (text) |
| 330 | I THINK SO | 6 | (text) |
| 335 | ZNRBAZGTUNKLM | 7 | (jpeg) |
| 340 | XOLVWPQALBTZC | 8 | (jpeg) |
| 345 | NVDURKARSBMHY | 9 | (jpeg) |
| 350 | GJJMZXOBELFID | 10 | (jpeg) |

FIG. 3

PATTERN COMPRESSIBILITY TABLE — 550

| Packet Number | Pattern Compressibility |
|---|---|
| 555 → 7 4 10 | Good Poor Good |
| 560 → 2 5 9 13 | Good Good Poor Good |
| 565 → 7 7 11 | Good Poor Good |
| 570 → 4 8 12 | Good Poor Good |

Compression Disable Table 635

| Media Type | | Compression Status |
|---|---|---|
| 640 — .M3U | (Streaming Music) | Disable |
| 645 — .JPG | (Image) | Disable |
| 650 — .RAA | (Real-Time Audio) | Disable |
| 655 — .MP3 | (Music) | Disable |
| 660 — .MPG | (Video) | Disable |
| 665 — Encrypted | | Disable |

FIG. 6C

HTTP WEBSTREAM

| 6 | 5 | 4 | 3 | 2 | 1 |
|---|---|---|---|---|---|
| Z.mp3 | P/o 3 | P/o 1 | Y.JPG | P/o 1 | X.HTML |

STREAM ASSOCIATION TABLE ,905

| | STREAM | MEDIA TYPE |
|---|---|---|
| 910 → | 1 | text (.html) |
| 915 → | 2 | JPEG (.jpg) |
| 920 → | 3 | MPEG (.mpg) |

ADAPTIVE COMPRESSION IN AN EDGE ROUTER

BACKGROUND OF THE INVENTION

Lempel-Ziv-Welch (LZW) compression is a dictionary-based compression algorithm; it has the distinct advantage that the dictionary is (i) created as the data is transmitted and (ii) tailored to the actual data. That is, when transmission starts, the dictionary contains only the standard ASCII characters. If the transmitted data includes the string "I think so", then the compression algorithm adds "I", "think", "so", "I think", and "I think so" (and all of their substrings) to the dictionary and assigns each entry a shorthand code. When the compression algorithm sees that string again, or any of the strings stored in the dictionary, it just transmits the shorthand code. So, for "I think so", rather than transmitting 10×8=80 bits, it might transmit a single 12-bit code. The code length depends on the dictionary size.

LZW compression works because most commonly transmitted data—text, spreadsheets, databases, etc.—contain a lot of repetition. Data with little or no repetition (for example, pure random numbers) do not compress. Some file types, such as PDF, JPG/JPEG, MP3, and ZIP have already been compressed, and LZW will not make them smaller. These file types can be created with Adobe Acrobat, digital cameras, MPEG encoders, and PKZIP, respectively. PKZIP and the V.42bis modem compression standard are examples of applications of LZW compression.

One obvious drawback of LZW compression is that the dictionary has a finite size; if the dictionary overflows then the compression effectiveness declines. For example, if you email a text document to two different people (two separate emails), the modem uses V.42bis and compresses the text from the first email. When the second email arrives on the heels of the first, the dictionary already contains the strings required to compress the document (remember, it is the same document), so the compression ratio is very high. But, if an email contains a text document and a JPEG file to each person, the modem uses V.42bis and compresses the text. However, the JPEG file cannot be compressed further, so the V.42bis compressor keeps adding more and more strings (bits of the JPEG picture) to the dictionary, until the dictionary no longer contains any of the original text file. When the second email arrives, the dictionary no longer contains any part of the text document, and has to begin all over; the compression ratio is therefore not as good.

This same problem can occur in Internet routers, where many different streams of data are sent to one user. For example, when a webpage is opened through a browser on a PC, the browser immediately starts downloading text, banner ads, text, pictures, text, etc. A brute-force compression algorithm (such as V.42bis) tries to compress everything, and may wind up compressing nothing because the dictionary keeps filling up with non-compressible JPEGs.

SUMMARY OF THE INVENTION

The problem with allowing compression protocols to run freely is that all data is attempted to be compressed, even if already in a compressed form (e.g., JPEG image files) and are, therefore, incompressible. While attempting to compress incompressible data, besides expending processing time, the process fills the associated compression dictionary with data patterns that have poor compressibility, which, in turn, removes data patterns from the compression dictionary that have good compressibility. Thus, the process takes time to refill the dictionary with data patterns providing efficient data compression.

By monitoring the data type of data streams, an Internet router, for example, employing the principles of the present invention, can make intelligent guesses as to which data streams are compressible. As a result of such a guess, the Internet router can enable and disable a compression process, thereby compressing different streams of data in an adaptive manner. By adaptively enabling compression, the associated dictionary maintains data patterns that keep the compression process efficient.

According to the principles of the present invention, in a data communication network supporting data compression, compression efficiency is optimized by filtering protocol-specific header and control information of a protocol data unit (PDU) to determine compressibility of the contents of the protocol data unit. Based on the result of the filtering, the state of data link compression is selected for the protocol data unit in a manner optimizing compression efficiency.

A filter performing the filtering may access a table having entries with specific media types deemed compression limited and associate individual PDUs to a specific media type. When associating the individual PDUs, the filter typically determines if a given PDU is associated with a previously filtered PDU and, if so, assigns the same state of data link compression for the given PDU as for the previously filtered PDU. To determine whether the given PDU is associated with a previously filtered PDU, the filter may access a table including information of previously filtered PDUs.

To select the state of the data link compression, the data link compression is disabled if the compressibility of the contents of the PDU is determined to be low.

Alternatively, to select the state of the data link compression, the data link compression is enabled if the compressibility of the contents of the PDU is determined to be high.

To optimize the compression efficiency further, a table used by the data link compression can be initialized with data patterns expected to be contained in the content of at least one PDU. For example, the table can be initialized to include start-up packets, such as syn-syn-ack.

BRIEF DESCRIPTION OF THE DRAWINGS

FIG. 3 is a diagram of a compression dictionary used by the embodiment of FIG. 2A;

FIG. 5B is a table diagram of a pattern compressibility table associated with processing the webstream of FIG. 5A;

FIG. 6C is a table diagram of a compression disable table having a subset of media types causing the compressor of FIG. 6A to be set to a disable state;

Figure 1:
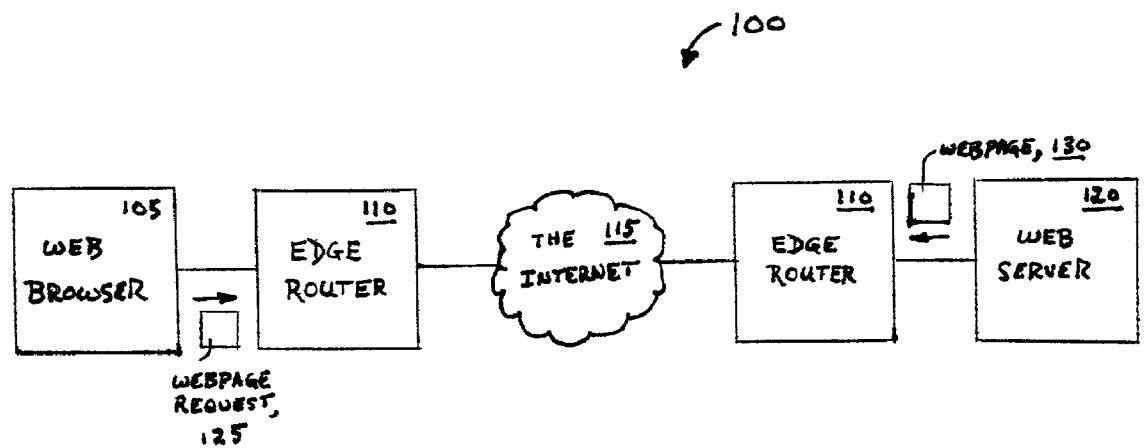
FIG. 1 is a block diagram of a web browser receiving a webpage from a web server via a wide area network.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

FIG. 1 is a block diagram of a wide-area network 100 in which the present invention may be deployed. The wide-area network 100 includes a web browser 105 coupled to an edge router 110. The edge router 110 is coupled to the Internet 115. On the other side of the Internet 115 is another edge router 110. The other edge router 110 is coupled to a web server 120.

In a typical Internet application, the web browser 105 sends a webpage request 125 to the web server 120. The webpage request 125 is sent in the form of a data packet, as shown. The webpage request 125 includes a destination request for the web server 120. By scanning the header in the webpage request 125 for the destination address, the edge router 110 is able to route the webpage request 125 through the Internet 115, and, eventually, the webpage request 125 is received by the web server 120.

In response to receiving the webpage request 125, the web server 120 transmits a requested webpage 130 to the web browser 105. Typical webpages include HTML files, which typically include text and references to image data. To reduce data transmission time through the network 100, the web server 120 or edge router 110 converts, or attempts to convert, the text and image data of the webpage 130 into a compressed format. After compression, there are fewer bytes of data representing the webpage 130 to transmit the network 100. Therefore, the web browser 105 receives the webpage 130 quicker than if the webpage 130 were sent in an uncompressed format.

Because of the various forms of data traveling across wire and wireless digital networks, compression varies in efficiency. For instance, a website may include text, bitmap images, JPEG formatted images, streaming audio, and streaming video. The text and bitmap images tend to be highly compressible, but the JPEG, streaming audio and streaming video tend to be poorly compressible.

The principles of the present invention makes data transmission between the web browser 105 and the web server 120 more efficient by making compression on the data being transmitted adaptive. In a wide-area data communication network, such as the Internet, the adaptive compression is employed in edge routers 110 or other network device that receives data in compressed or uncompressed data formats. By adaptively compressing the data, data that is compressible is compressed; data that is incompressible is not attempted to be compressed, or further compressed as the case may be. By not attempting to compress incompressible data, processing cycles are saved and entries in compression dictionaries are kept available for data that is compressible, thereby maximizing data compression ratios.

The adaptive compression enables a subordinate protocol layer to be aware of the compressibility of the protocol data units (PDUs) of the higher protocol layer it carries. So, without changes to the higher protocol layer or the compression algorithm of the subordinate layer, the subordinate protocol layer improves efficiency of its compression, thereby enabling greater throughput on the connection to which the adaptive compression is applied. Thus, the present invention is independent of the protocol layer at which it is employed.

A process employing the principles of the present invention monitors data streams in an HTTP webstream, for example. The process filters protocol-specific header and control information to determine compressibility of the data contained in a data packet. For example, if the filtering indicates that the data is a compressible type, such as text, then the process enables the data link compression. In contrast, if the filtering indicates that the data is an incompressible type, such as JPEG, then the process disables the data link compression.

Further, in networking environments supporting the hypertext transport protocol in which, after the first data packet of a given stream, the following data packets in the given stream typically do not indicate data type, the process determines whether a given packet is part of the given stream and, if so, processes the given packet in accordance with the state of data link compression for that stream. By applying the same state of the adaptive compression to all data packets of a given stream, the process maximizes processing efficiency. To assist, the process may construct a table or other data structure to keep track of the streams in the HTTP webstream.

The adaptive compression works within existing networking systems without affecting the data and without requiring an introduction of additional networking equipment in the data transmission path.

Figure 2A:
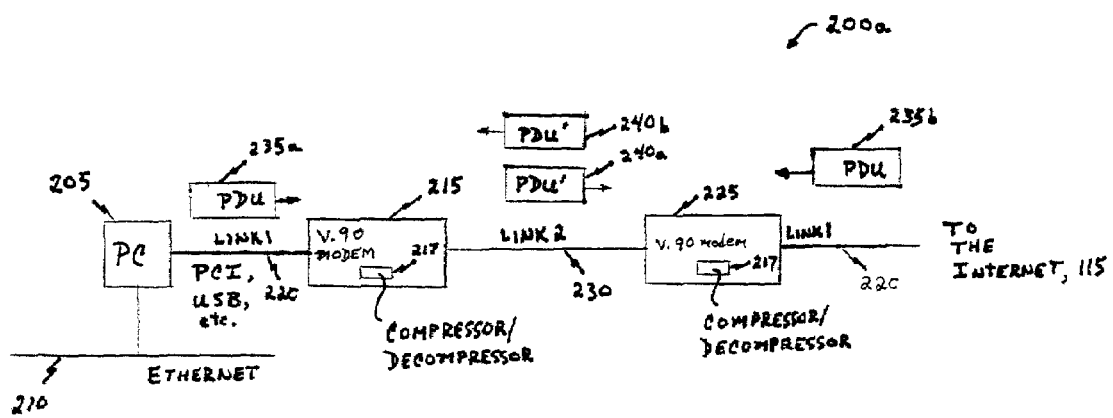
FIG. 2A is a block diagram of network computing devices typically coupled to the wide area network of FIG. 1 in which an embodiment of the present invention is employed.

FIG. 2A is a block diagram of a portion of a network 200 in which an embodiment of the present invention may be deployed. In the network 200, a personal computer (PC) 205 is connected to an Ethernet 210, across which the PC 205 can retrieve data or files for transmission to other network devices. The PC 205 transmits and receives data across the Ethernet 210 or to the Internet 115 across a V.90 modem.

When sending or receiving data across the digital subscriber lines, the PC 205 sends or receives the data to a proximal V.90 modem 215 via link1 220, referred to herein as a first link 220. The first link 220 may be one of various types of bus structures, such as PCI, USB, etc. The proximal V.90 modem 215 includes a compressor/decompressor 217. The proximal V.90 modem 215 uses V.42bis compression.

The proximal V.90 modem 215 is coupled to a distal V.90 modem 225. The distal V.90 modem 225 also includes a compressor/decompressor 217. The distal V.90 modem 225 is further coupled to the Internet 115 through the first link 220. It should be understood that other modems using other compression protocols may be used in accordance with the principles of the present invention.

When sending data to the Internet, the PC 205 sends a protocol data unit (PDU) 235a across the first link 220 to the proximal V.90 modem 215. A protocol data unit is defined as a packet of data that is formatted according to a given data type protocol, such as HTTP, JPEG, streaming audio, etc. The proximal V.90 modem 215 attempts to compress or further compress the PDU 235a by using the compressor/decompressor 217. The proximal V.90 modem 215 sends the compressed data, PDU' 240a, across link2 230, referred to herein as a second link 230, to the distal V.90 modem 225. In the distal V.90 modem 225, the compressor/decompressor 217 decompresses the PDU' 240a according to a process reversing the compression applied by the proximal V.90 modem 215. The uncompressed PDU 235a continues across the first link 220 to its final destination.

The PDU 235b sent from a network node (not shown) to the PC 205 travels in the reverse direction. The PDU 235b travels across the first link 220 in an uncompressed form to the distal V.90 modem 225. In the distal V.90 modem 225, the compressor/decompressor 217 compresses or attempts to further compress the PDU 235b into a compressed form, PDU' 240b, according to a process reversing the compression applied by the distal V.90 modem 225. The compressor/decompressor 217 in the proximal V.90 modem 215 decompresses the PDU' 240b. Finally, the uncompressed form of the PDU 235b is passed by the proximal V.90 modem 215 across the first link 220 to the PC 205.

Normally, the V.42bis compression attempts to compress all the traffic. Here, however, the adaptive compression augments the V.42bis compression, without changing the V.42bis compression, by enabling and disabling the application (i.e., usage) of the V.42bis compression algorithm. In this way, the compression is applied to streams of data without the knowledge of the endpoints (e.g., PC 205 and Internet server (not shown)).

Thus, across the physical link of the V.90 modems, the V.42bis compression is unaware of the compressibility of the link layer, i.e., the contents of the data contained in the data packets composing the traffic. By employing the adaptive compression according to the principles of the present invention, the capacity of the V.90 connection (i.e., link) is improved due to the increased efficiency of the V.42bis compression.

Figure 2B:
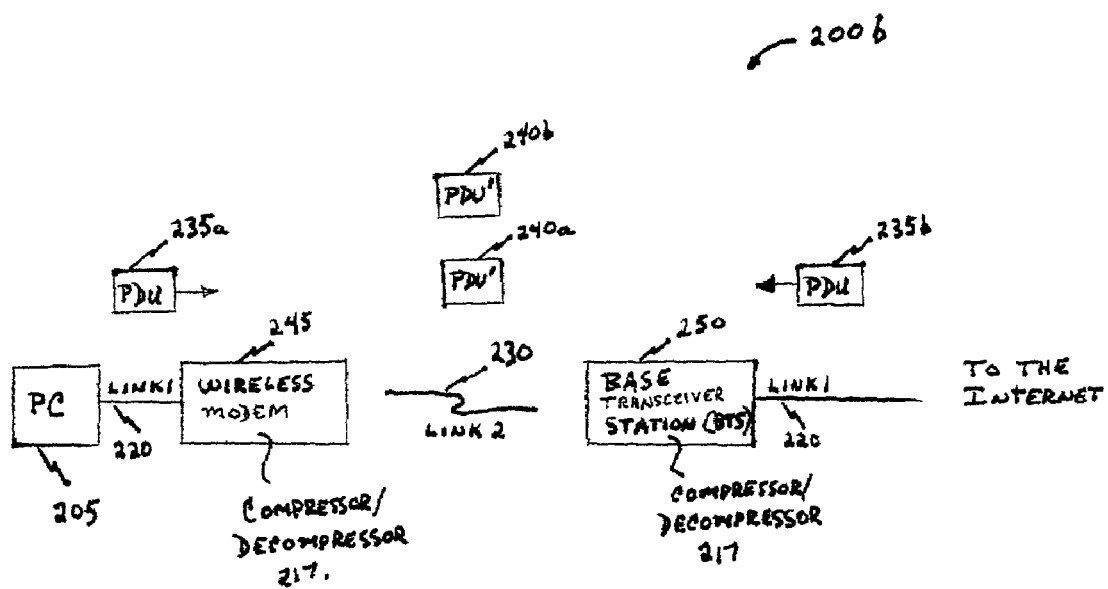
FIG. 2B is a block diagram of wireless network devices also typically coupled to the wide area network of FIG. 1 and also using the embodiment of the present invention of FIG. 2A.

FIG. 2B is a block diagram of a network 200b that includes a wireless link. As shown, the PC 205 is coupled to a wireless modem 245 by a first link 220. The wireless modem 245 includes a wireless modem (not shown) and a compressor/decompressor 217. The wireless modem 245 is coupled to a base transceiver station (BTS) 250, sometimes referred to as a base station, by a wireless link, link2 230. The BTS 250 includes a compressor/decompressor 217. The BTS 250 is coupled to other network devices across the first link 220.

As in the wire network 200a (FIG. 2A), the first link 220 of the wireless network 200b carries uncompressed protocol data units. And, similar to the link2 230 of network 200a, the link2 230 of the wireless network 200b carries compressed protocol data units. Again, by transmitting compressed protocol data units, the transmission times of those protocol data units are reduced.

Normally, the radio link protocol (RLP) employs compression (e.g., V.42bis) that attempts to compress all the traffic. Here, however, the adaptive compression augments the compression algorithm, without changing the compression algorithm, by enabling and disabling the application of the compression algorithm.

Thus, across the wireless link between the wireless terminal 245 and the BTS 250, the RLP is unaware of the compressibility of the layer it carries. Typically, the RLP carries a PPP link layer or an IP network layer traffic stream.

In the case of the PPP link layer, the RLP is unaware of the compressibility of the contents of the PPP frames. In the case of the IP network layer, the RLP is unaware of the compressiblity of the contents of the IP packets. In both cases, by employing this adaptive compression according to the principles of the present invention, the capacity of the wireless connection is improved due to the increased efficiency of the radio-link compression.

To compress the protocol data units, the compressor 217 uses a compression dictionary. A compression dictionary includes representations of data found in previous protocol data units. Using the compression dictionary, the compression process attempts to reduce the representations found in future data units to a smaller form for transmission. An example of a compression dictionary is seen FIG. 3.

FIG. 3 is a table diagram of a compression dictionary 300 having data seen in recently transmitted protocol data units. The compression dictionary 300 includes entries of patterns and codes. The patterns can be of various data formats (e.g., text, JPEG, mpeg, etc.); the codes are representations for the patterns when compressed.

In the compression dictionary 300, entry 305 includes a pattern "I" having a corresponding code 1. Entry 310 is the pattern "think" having a code 2. Entry 315 is the pattern "so" having a corresponding code 3. The entries continue to entry 330 through combinations of the words "I think so". Following entry 330, entries 335-350 include JPEG entries in which textual representations of JPEG codes are contained. The reason the JPEG representations are unrecognizable is because JPEG format is a compressed format, which means that redundancy has already been removed and only representations of actual data remain. It is unlikely that the entries 335-350 will result in further compression of the data being transmitted across the network. Therefore, the JPEG codes are merely taking up entries in the compression dictionary 300, resulting in poor compression ratios.

Figures 4A, 4B:
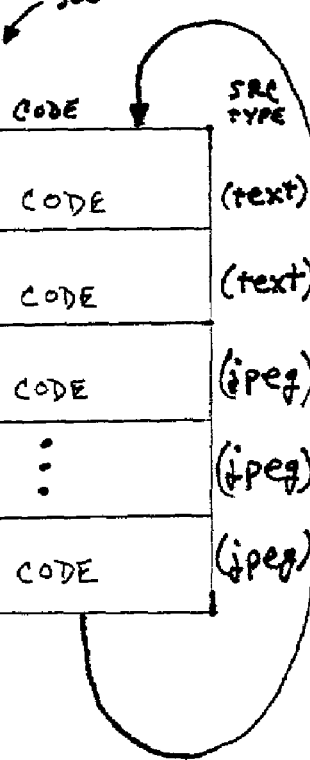
FIG. 4A is a diagram representative of the compression dictionary of FIG. 3.
FIG. 4B is a diagram also representative of the compression dictionary of FIG. 3.

FIGS. 4A and 4B are generic representations of compression dictionaries. The compression dictionary 300 in FIG. 4A indicates patterns and codes as entries in the compression dictionary 300. To the right of the compression dictionary 300 is the source type of the data from which the pattern entry is derived.

The compression dictionary 300 of FIG. 4B provides an indication of the quality of the pattern and its correspondence to a source type. As expected, patterns from text source types are "good" patterns, and entries from JPEG source types are "poor" patterns. The terms "good" and "poor" refer to the value of the pattern in terms of their effectiveness (i.e., expected repetition rate) in compressing data expected to be seen in data packets in a webstream.

The compression dictionary 300 of FIG. 4B is indicated as being a circular buffer or cache. If a circular buffer form of memory is allocated for the compression dictionary 300, then a processor storing entries in the compression dictionary 300 replaces old entries (i.e., patterns and corresponding codes) in a first in-first out basis. Therefore, in the compression dictionary of FIG. 4B, if poor patterns continue beyond the last entry in the compression dictionary 300, then the good patterns at the top of the compression dictionary 300 are replaced with the poor patterns, eventually filling the entire compression dictionary 300 with poor patterns and rendering the compression dictionary 300 ineffective.

In the case of a cache memory, entries may be replaced in another manner, such as randomly or other replacement paradigm. The idea behind both types of memory formats is that the compression dictionary 300 does not have unlimited memory; therefore, there is always a likelihood that the entire compression dictionary 300 can be filled with poor pattern entries.

Figure 5A:
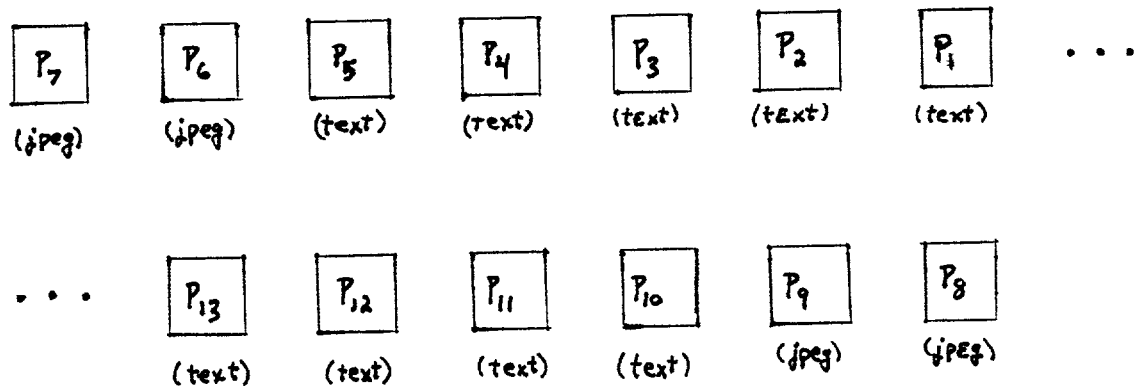
FIG. 5A is a block diagram of a webstream processed by the embodiment of FIG. 2A.

FIG. 5A is a schematic diagram of a webstream 500. The webstream includes packets $P_1$-$P_3$. Beneath the packets is an indication of the type of data being transmitted in the packets. Packets $P_1$-$P_5$ and $P_{10}$-$P_{13}$ contain text. Packets $P_6$-$P_9$ include JPEG data.

FIG. 5B is a table diagram of a pattern compressibility table 550 corresponding to a compression dictionary 300 being used by a compression process to compress data in data packets in streams in the webstream 500. The pattern compressibility table 550 includes two fields: a packet number field 575 and a pattern compressibility field 580. In the two fields 575, 580, the pattern compressibility table 550 includes entries 555, 560, 565, and 570 from the packets of the webstream 500 (FIG. 5A).

The first entry 555 includes data from packet $P_1$, and, as expected, has a "good" pattern compressibility. After a certain time, the entry 555 data from packet $P_1$ is replaced with data from packet $P_6$, which includes data from a JPEG source, which has "poor" pattern compressibility. A certain time later, entry 555 has data from packet $P_6$ replaced with data from packet $P_{10}$, which has a corresponding "good" pattern compressibility. The process continues for entries 560-570, replacing data from previous packets with data from newer packets. As should be understood, if data from packets $P_6$-$P_9$ are all stored as entries in a compression dictionary 300 (FIG. 4A), then the corresponding pattern compressibility table 550 will have all "poor" indications in the pattern compressibility field 580.

Figure 6A:
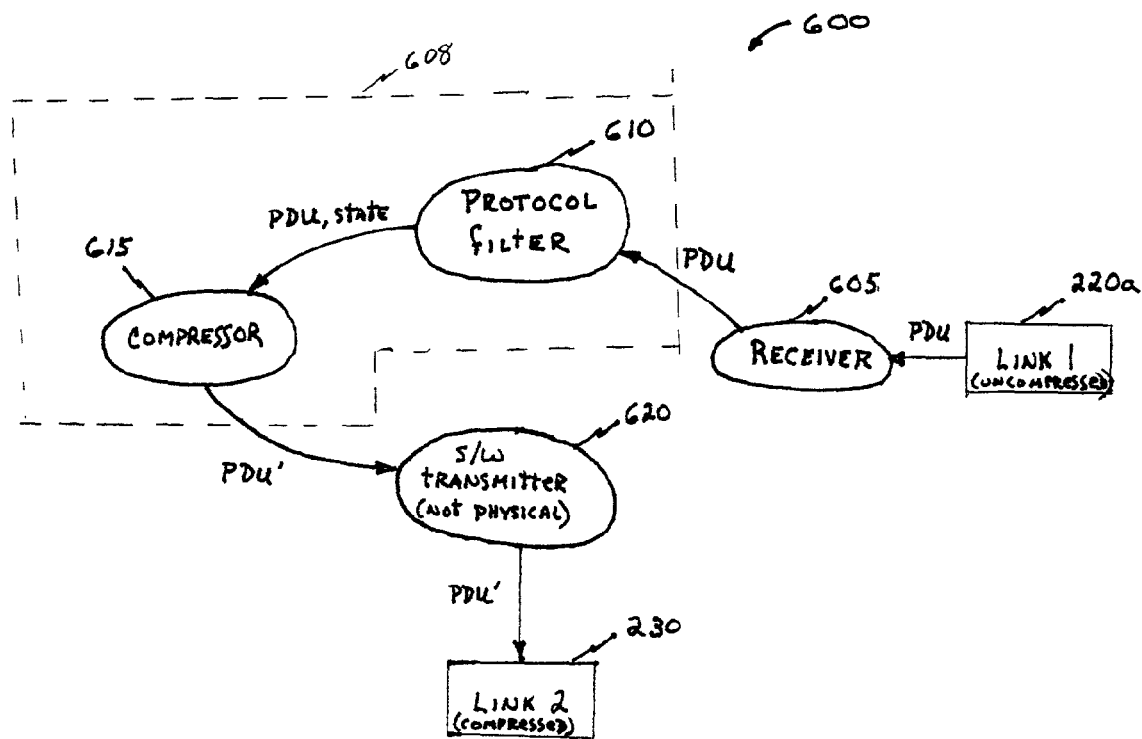
FIG. 6A is a block diagram of components composing an embodiment of a protocol filter for adaptively compressing data in the network of FIG. 2A.

FIG. 6A is a block diagram of an embodiment of a structure 600 executing in one or more devices of a data communication network (e.g., network 100, 200a, 200b). The structure 600 includes a first link 220a across which uncompressed protocol data units (PDU) are transmitted. A receiver 605 receives the protocol data unit. The receiver 605 forwards the received PDU to a filter/compressor unit 608, which compresses the PDU according to the principles of the present invention. The filter/compressor unit 608 produces a compressed PDU, which is indicated as PDU'. The PDU' is received by a software transmitter 620, which transmits the PDU' to a second link 230.

Inside the compressor/filter unit 608 is a protocol filter 610. The protocol filter 610 scans the protocol-specific header and control information of the protocol data unit to determine compressibility of the contents of that protocol data unit. By filtering the protocol-specific header and control information, the protocol filter 610 is able to determine whether the PDU contains data of a data type that is generally compressible. If the PDU does contain data that is generally compressible, then the protocol filter 610 sets a state variable to "enable" to enable a compressor 615 to compress the data in the PDU. If the PDU contains data that is not generally compressible, then the protocol filter 610 sets the state variable to "disable", which disables the compressor 615 from attempting to compress the PDU.

The compressor 615 typically maintains the compression dictionary 300 (FIG. 3) and attempts to reduce the data in the PDU for transmitting a compressed representation of the PDU across the network. Thus, if the data type in the PDU is generally poorly compressible, then disabling the compressor 615 keeps the compression dictionary 300 filled with entries that can provide good compression ratios. Also, disabling the compressor 615 for a PDU that has poor compressibility reduces the number of wasted instruction cycles for the compressor 615 that would otherwise have spent time trying to compress the poorly compressible data, such as JPEG data.

The compressor 615 includes an indication in or with the PDU' to indicate whether the PDU has been compressed by the compressor 615. In this way, an associated decompressor (see FIG. 7) will know to decompress the PDU' in a manner previously negotiated.

It should be understood that the representation of the PDU output by the compressor 615 is almost always optimally compressed because (i) a PDU that is compressible will be compressed by the compressor 615, and (ii) a PDU that is poorly compressible is typically already compressed or non-compressible. Therefore, the output of the compressor 615, whether or not compressed by the compressor 615, is almost always optimally compressed. An exception is found in the case of an encrypted protocol data unit that is not in a compressed format, but compressing the PDU will render the PDU irreversibly compressed.

Figure 6B:
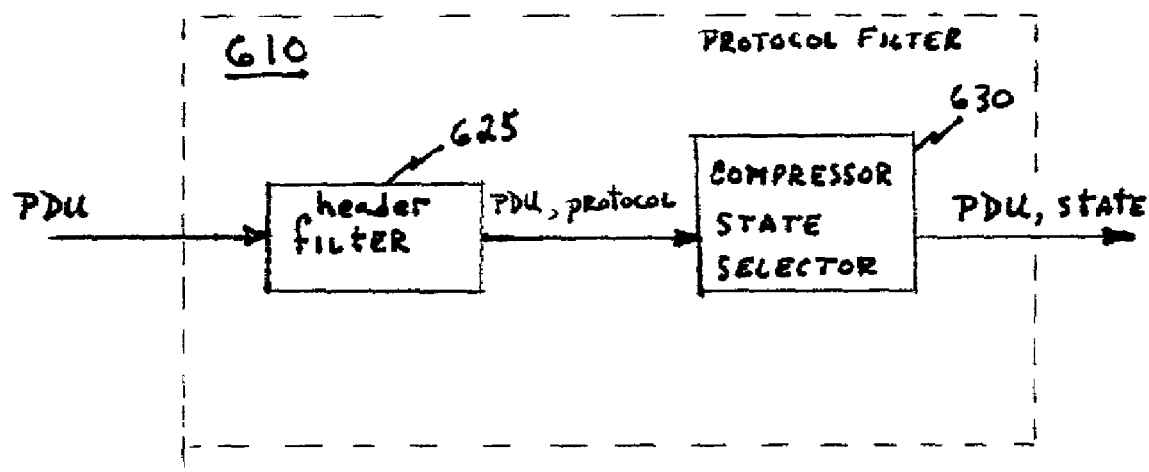
FIG. 6B is a block diagram of an embodiment of the protocol filter of FIG. 6A.

FIG. 6B is a block diagram of the protocol filter 610. The protocol filter 610 includes a header filter 625 and a compressor state selector 630. The header filter 625 receives the PDU and scans the protocol-specific header and control information of the PDU. From the protocol-specific header and control information of the PDU, the header filter 625 determines the compressibility of the contents of the PDU.

The header filter 625 forwards the PDU and an indication of the respective PDU protocol to the compressor state selector 630. The compressor state selector 630 has knowledge of various types of data protocols and knowledge of the compressibility of the data protocols. Based on the compressibility of the protocol, the compressor state selector 630 determines a state of an enable/disable variable which tells the compressor 615 (FIG. 6A) whether to attempt to compress the PDU, for reasons discussed above.

FIG. 6C is a table diagram of a compression disable table 635. The compression disable table 635 is used by the compressor state selector 630 (FIG. 6B) to determine the state variable used to enable and disable the compressor 615 (FIG. 6A). The compression disable table 635 includes media types and corresponding compression status for the media types. As shown, the first entry 640 is a .M3U media type used for streaming music across a data packet network. The corresponding compression status state is set to "disable" since streaming music is already a compressed format. The second entry 645 is JPEG media type, which is a compressed image type; therefore, the compression status state is set to "disable". The third through fifth entries are all compressed media types, and therefore, the compression status states are all set to "disable". The last entry 665 is an encrypted media type. Since compressing the encrypted media type results in being unable to decompress accurately the encrypted media type, the compression status state is set to "disable".

It should be understood that the compression disable table 635 may also include media type entries that set the compression status state to "enable". However, by storing only media types with corresponding compression status states of "disable", the compression enable table 635 can be smaller, and the compressor state selector 630 (FIG. 6B) need only change the state of the state variable to "disable" in the event of receiving a media type listed in the compression disable table 635.

Figure 7:
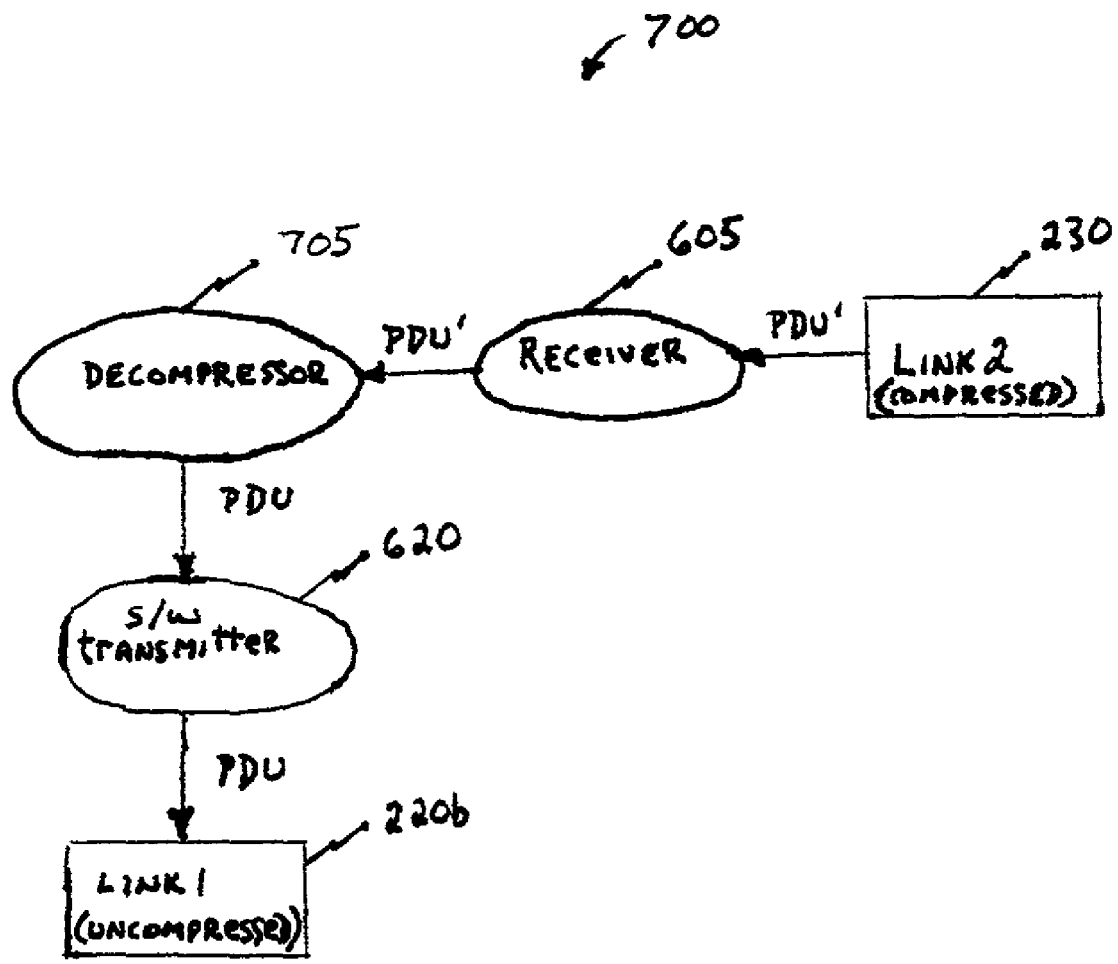
FIG. 7 is a block diagram of components for decompressing data compressed by the protocol filter of FIG. 6A.

FIG. 7 is a block diagram of processing units 700 executing on one or more devices of a data communication network that decompresses the protocol data units compressed by the filter/compressor unit 608 of FIG. 6A. From link2 230, a receiver 605 receives a compressed PDU, represented by PDU'. The receiver 605 forwards the PDU' to a decompressor 705. The decompressor 705 decompresses PDU' and outputs the PDU. The decompressor 705 transmits the PDU to a software transmitter 620. The software transmitter 620 transmits the PDU to the first link 220 to its final destination. It should be understood that link2 230 is a type of link over which it is preferable to send compressed protocol data units, and the first link 220 is the type of link that transmitting uncompressed protocol data units is acceptable.

Figures 8A, 8C:
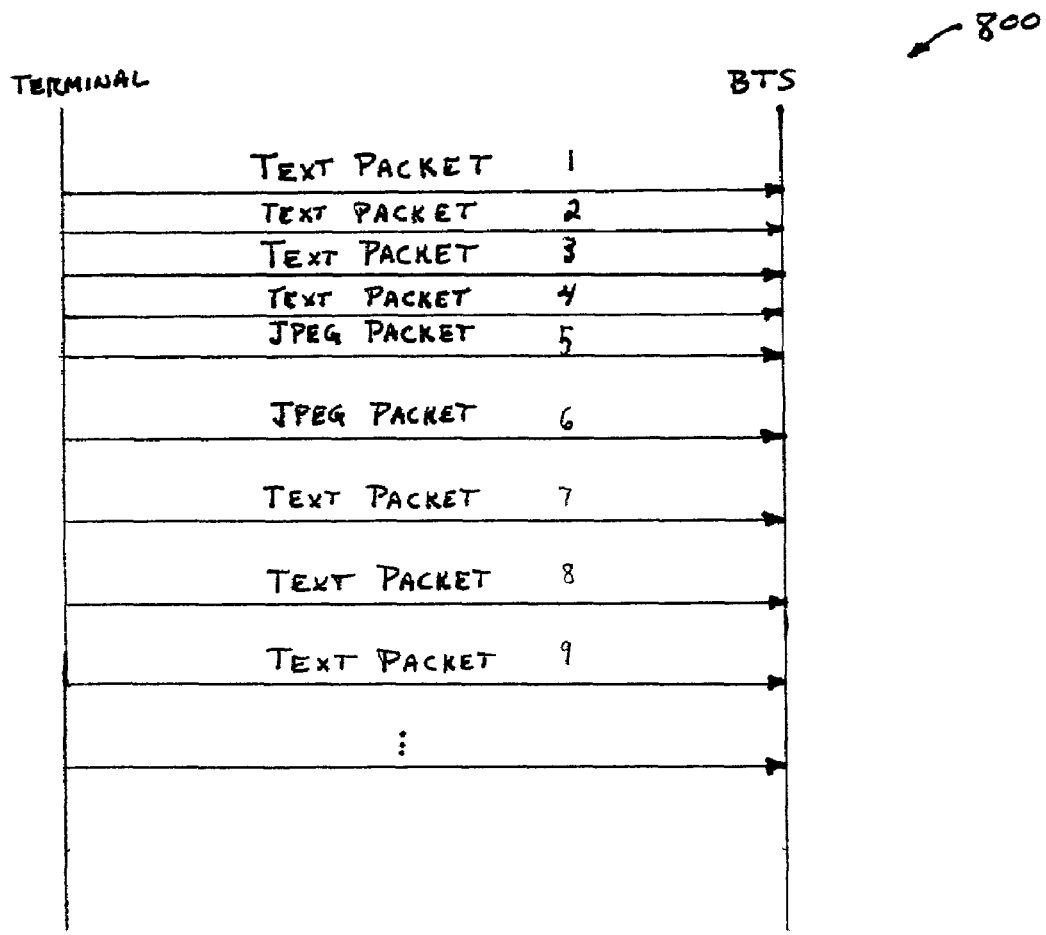
FIG. 8A is a packet diagram of packets transmitting between the terminal and base station of FIG. 2B.
FIG. 8C is a diagram of the pattern compressibility table corresponding to the packets and state of compression of FIG. 8B.

FIG. 8A-8D illustrate the use of the filter/compressor unit 608 (FIG. 6A). Referring first to FIG. 8A, a packet diagram is provided that illustrates a terminal (e.g., wireless modem 245, FIG. 2B) and base station (e.g., BTS 250, FIG. 2B) between which data packets are communicated. The first four packets are text packets, followed by two JPEG packets, then three more text packets. Handshaking data is not shown in the packet diagram 800, but is provided in FIG. 8D.

Figure 8B:
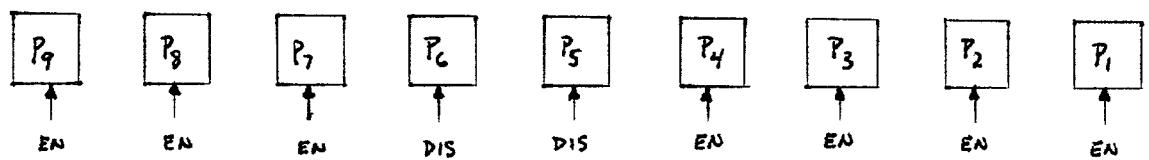
FIG. 8B is a webstream diagram of the packets of FIG. 8A including indications of the corresponding state of compression determined by the protocol filter of FIG. 6A.

Referring now to FIG. 8B, a webstream 805 corresponding to the packet diagram 800 is shown along with the state of compression for processing the data packets in the webstream 805. As expected, the protocol filter 610 (FIG. 6A) maintains the compression state variable as "enable" for packets $P_1$-$P_4$ to allow data compression to operate on the packets. The protocol filter 610 sets the compression state corresponding to packets $P_5$ and $P_6$ to "disable" to prevent the compressor 615 from attempting to compress the poorly compressible JPEG data. Also, the protocol filter 610 maintains the state of compression for the compressor 615 as "enable" to allow the data packets $P_7$-$P_9$ to be compressed.

FIG. 8C is a table diagram of a pattern compressibility table 810 corresponding to the data transmissions of FIG. 8A and corresponding states of FIG. 8B. Data from packets $P_1$-$P_4$ fill the first four entries of the pattern compressibility table 810, as expected, because packets $P_1$-$P_4$ contain text data, which is highly compressible, as indicated in the packet diagram 800. The pattern compressibility table 810 does not include packets $P_5$ and $P_6$ because the protocol filter 610 (FIG. 6A) determines from the protocol-specific header and control information of protocol data units $P_5$ and $P_6$ that the data contained therein is already in a compressed data format, specifically JPEG. The protocol filter 610, however, determines that data packets $P_7$-$P_9$ contain data in a text format, and, therefore, are compressible. Thus, entry $P_1$ is said to "age out" and is replaced with packet $P_7$. Further, packet $P_2$ is replaced with packet $P_8$, and packet $P_3$ is replaced with packet $P_9$.

As seen in the pattern compressibility field of the pattern compressibility table 810, each of the packets included in the pattern compressibility table 810, as result of being filtered by the protocol filter 810, is of "good" pattern compressibility. Therefore, the corresponding compression dictionary 300 (FIG. 4A) contains entries that make the compressor 615 (FIG. 6A) highly efficient as a result of the compressor 615 being enabled and disabled by the protocol filter 610.

Figure 8D:
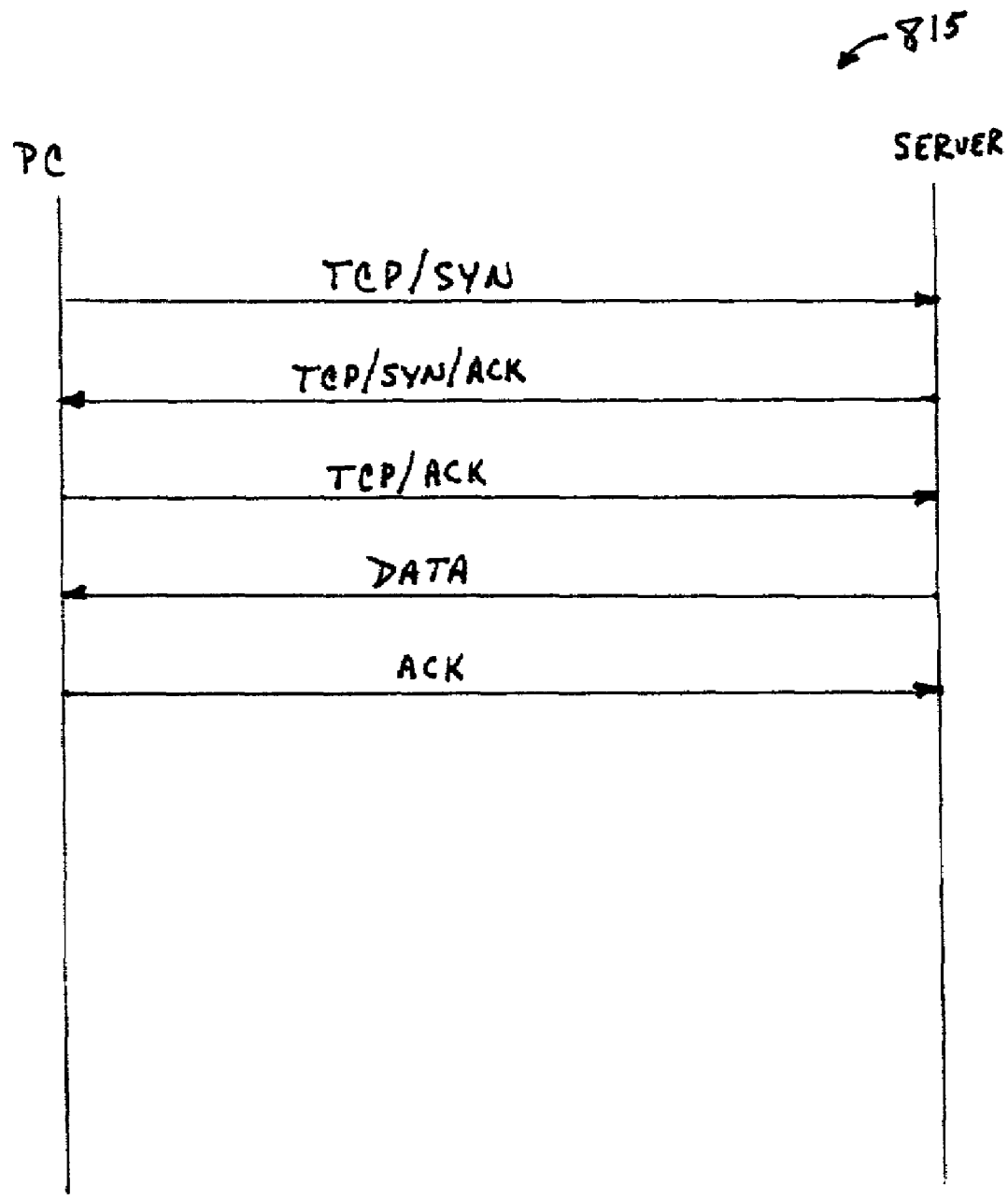
FIG. 8D is a packet diagram of connection protocol packets transmitting between the web browser and web server of FIG. 1.

FIG. 8D is a packet diagram 815 of a personal computer (PC) communicating with a server. This packet diagram 815 includes connection protocol packets for instantiating a connection. The PC first transmits a TCP/SYN signal to the server. The server, in response to the TCP/SYN responds with an acknowledge signal, TCP/SYN/ACK. The PC then responds with its own acknowledge signal, TCP/ACK. The server then transmits data directed for the PC. The PC, after receiving all of the data, transmits a corresponding acknowledge signal, ACK.

According to the principles of the present invention, although usually reactive in nature, the compressor 615 can initialize the compression dictionary 300 with data that is expected to be present in the connection protocol packets. Specifically, the compressor 615 initializes the compression dictionary 300 with entries "TCP/SYN", "TCP/SYN/ACK", "TCP/ACK", and "ACK". In this way, even though the connection protocol packets include data that is less than 64 bytes and is, therefore, usually not compressed by the compressor 615, the compressor 615 makes the usually-inefficient connection protocol packet compression efficient by initializing the entries of the compression dictionary 300 with data of the connection protocol packets.

It should be understood that the present invention can support compression of connection protocols, sometimes referred to as signaling compression. In this case, the compressor 615 analyzes the signaling packets as it does any other message, segment/datagram, packet, frame, or symbol, depending on the layer being compressed.

Signaling compression uses a combination of header field compression, such as RObust Header Compression (ROHC) and binary compression, such as Lempel-Ziv, to explicitly compress signaling flows apart from typical UDP/IP and TCP/IP data traffic. Signaling compression is concerned with signaling flows, such as Session initiation Protocol (SIP), Session Description Protocol (SDP), and Real Time Streaming Protocol (RTSP). There is some thought that the methods applied in signaling compression could be extended to other ASCII based protocols, such as HTTP.

However, there are at least three differences between the adaptive compression of the present invention and the signaling compression just described, which, in general, is directed to solving the problem of either (i) long round-trip times (RTT) in call set-up time with SIP and SDP or (ii) long control time with RTSP. First, signaling compression considers compression of signaling flows only. Second, while signaling compression may be efficient for ASCII protocols, it is not efficient for non-ASCII protocols. Third, signaling compression does not consider application data or distinguish between application types.

It should also be understood that the idea of the compressor 615 initializing the compression dictionary 300 can be extended to initializing the compression dictionary 300 with data expected to be found on, for example, a homepage to which a browser operating on the personal computer associated with the compressor 615 begins an Internet session. Thus, the compressor 615 can anticipate the transmission of data on the homepage by initializing the compression dictionary 300.

Figures 9A, 9B:
FIG. 9A is a block diagram of an HTTP webstream having plural streams and being processed by the components of FIG. 6A.
FIG. 9B is a table diagram of a stream association table having correspondence between the streams and respective media types transmitting in the HTTP webstream of FIG. 9A.

FIG. 9A is an HTTP webstream 900 in which three streams of data are interposed in the HTTP webstream 900, which is common. The first data packet includes the beginnings of a file titled "x.html". The second data packet includes more data from the file x.html. The third data packet includes data from a JPEG file, titled "y.jpg". The fourth data packet includes more data from the file x.html. The fifth data packet includes more data from the file y/jpg. The sixth data packet is the beginnings of a music file, titled "z.mp3".

As well known in the art, the packet headers in all but the first packet of a stream do not include the name of the file with which the data packet is associated. Therefore, the protocol filter 610 must analyze the protocol-specific header and control information to determine with which stream the packet is associated. For example, data packets $P_2$ and $P_4$ are associated with data packet $P_1$, which begins the first stream in the HTTP webstream 900. Similarly, the data packet $P_5$ is associated with data packet $P_3$, which is the first data packet in the second webstream.

FIG. 9B is a table diagram of a stream association table 905 that the protocol filter 610 uses to keep track of the streams. The stream association table 905 includes entries 910, 915, and 920, which each include a "stream" field and a "media type" field. The first entry 910 is for the first stream, which has a corresponding media type of text for the .html file. The second entry 915 is for the second stream, which is media type JPEG (.jpg). The third entry 920 is for the third stream, which is for media type MPEG (.mpg).

When the protocol filter 610 determines that the second data packet is part of the first stream, the protocol filter 610 maintains or sets the compressor state variable to "enable". Likewise, when the protocol filter 610 sees data packet $P_5$, the protocol filter 610 determines that the data packet $P_5$ is associated with the second stream and sets the compressor state variable to "disable", thereby disabling the compressor 615 from trying to compress the JPEG data contained in the fifth data packet.

It should be understood that, though enabling and disabling the compressor 615 (FIG. 6A) is generally a binary process, according to the principles of the present invention, the adaptive compression can be made analog. For example, there may be certain times of the day that the adaptive data compression can be employed, selected data packets in streams can be compressed, and so on.

Figure 10:
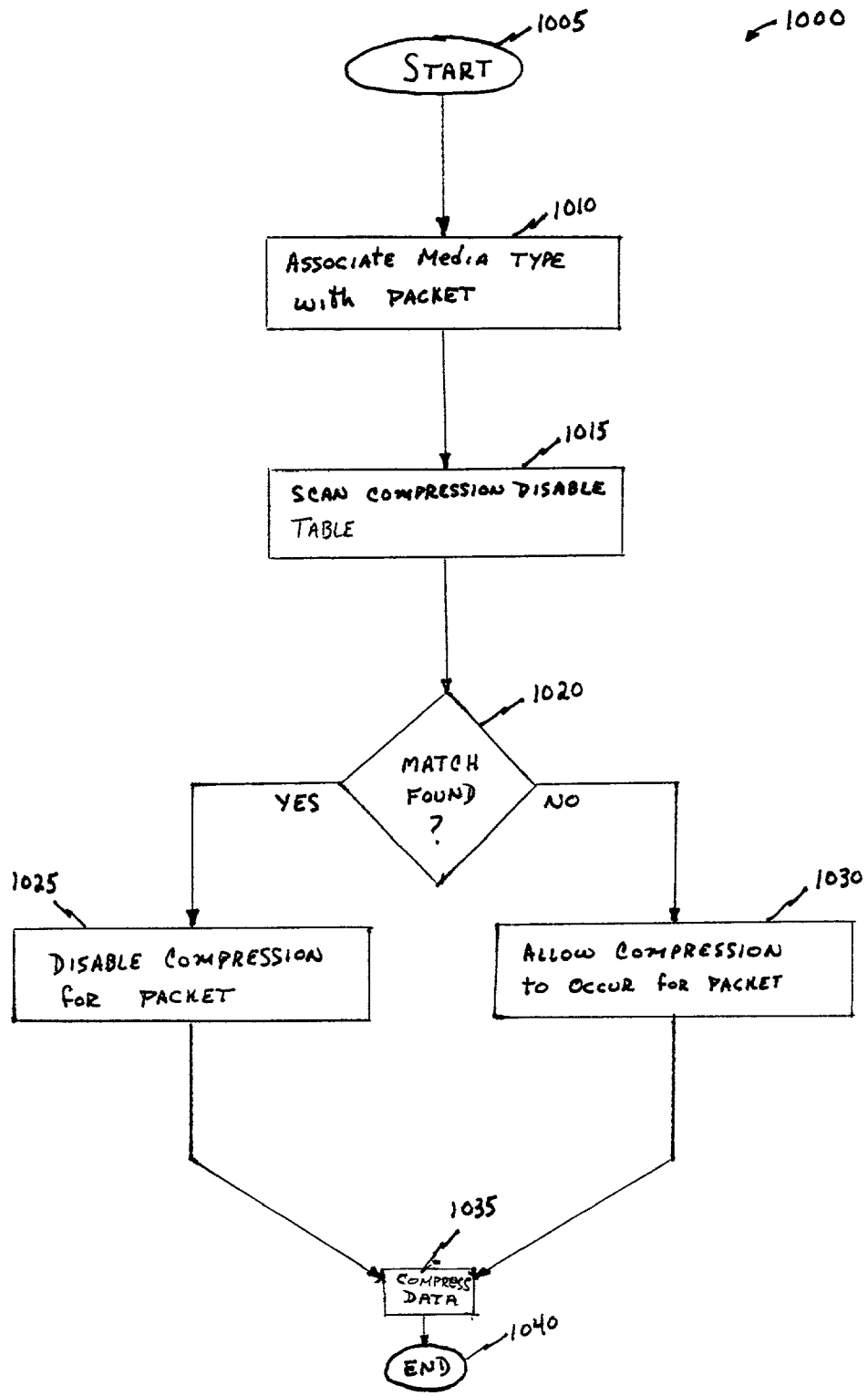
FIG. 10 is a generalized flow diagram of an embodiment of a process exercised by the components of FIG. 6A.

FIG. 10 is a flow diagram of an embodiment of the process 1000 executed by the protocol filter 610 and compressor 615 of FIG. 6A. The process 1000 begins in step 1005. The protocol filter 610 associates a media type with the packet in step 1010. The protocol filter 610 then scans the compression disable table 635 (FIG. 6C) in step 1015 to determine if the media type associated with the data packet is compressible.

In step 1020, the protocol filter 610 determines if a match was found from among the entries in the compression disable table 635. If a match was found, then, in step 1025, the protocol filter 610 sets the state of the compressor state variable to disable the compression for that particular packet. If a match was not found in step 1020, then in step 1030, the protocol filter 610 allows compression to occur for that packet by setting the compressor state variable to "enable". Following steps 1025 and 1030, the data compression occurs during step 1035 based on the state of the compressor state variable, as determined by steps 1025 and 1030. After data compression has taken place, then the process 1000 ends in step 1040.

Figure 11A:
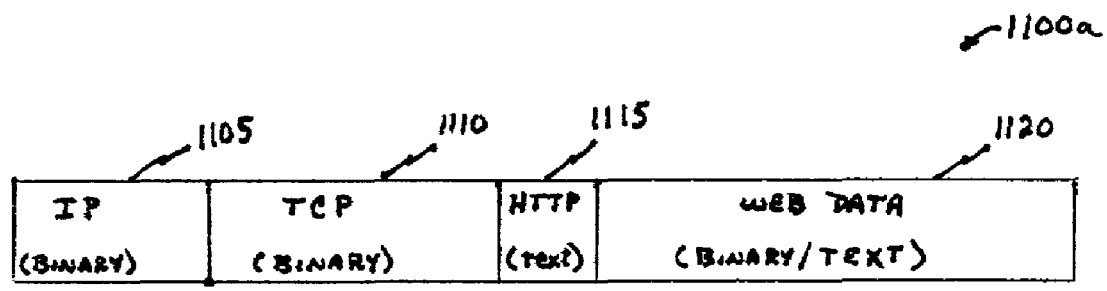
FIG. 11A is a schematic diagram of an IP packet having possible compressible data operated on by the process of FIG. 10.
Figure 11B:
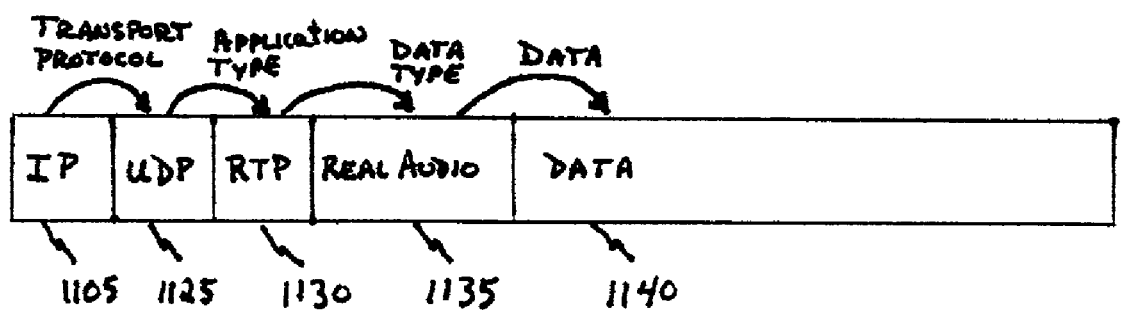
FIG. 11B is a schematic diagram of an IP packet having incompressible data operated on by the process of FIG. 10.

FIGS. 11A and 11B are schematic diagrams of exemplary data packets on which the process 1000 (FIG. 10) operates. FIG. 11A is a data packet 1100a having HTTP data. FIG. 11B includes a data packet 1100b with real audio data.

Referring first to FIG. 11A, the data packet 1100a has three sections in the header portion of the data packet, namely: IP section 1105, TCP section 1110, and HTTP section 1115. The IP section 1105 tells the process 1000 (FIG. 10) executing in the protocol filter 610 (FIG. 6A) what the transport protocol is. Here, the IP section 1105 tells the process 1000 that the transport protocol is TCP, as seen in the TCP section 1110. The TCP section 1110 indicates to the process 1000 executing in the protocol filter 610 that the application type is HTTP, as seen in the HTTP section 1115. The HTTP section indicates to the process 1000 executing in the protocol filter 610 that there is a new object, which is web data having either binary or text format, as seen in the web data section 1120. Because the format is HTTP, which is compressible, the protocol filter 610 sets the state of the compressor state variable to "enable".

In an alternative embodiment, the state of the compressor state variable begins as "enable", and, therefore, the process 1000 need not change the state of the variable.

Referring now to FIG. 11B, the data packet 1100b has several header sections in the header, including: an IP section 1105, UDP section 1125, RTP section 1130, real audio section 1135, and data section 1140. As shown, the IP section 1105 tells the process 1000 that the transport protocol is UDP. The UDP section 1125 indicates to the process 1000 (FIG. 10) that the application type is RTP. The RTP section 1130 indicates to the process 1000 that the data type is "real audio". The real audio section 1135 tells the process 1000 that the data is in the data section 1140.

Figure 12:
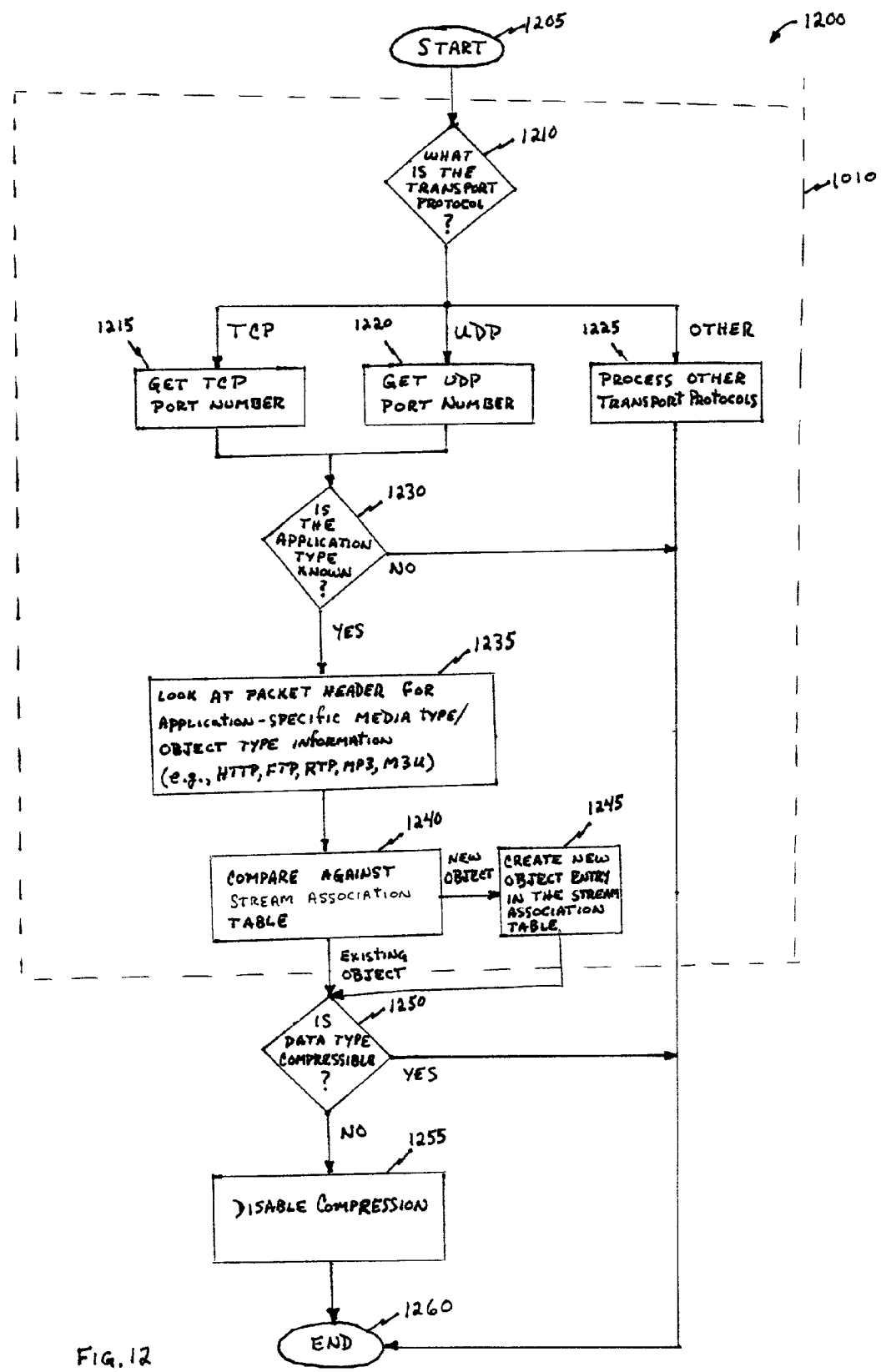
FIG. 12 is a detailed flow diagram of an embodiment of the process of FIG. 10.

FIG. 12 is a flow diagram of a detailed process 1200 for processing the many types of data packets that are used in data packet communication networks, such as the Internet. The detailed process 1200 expands upon, in particular, step 1010 of the more generalized process 1000 of FIG. 10. Specifically, the detailed process 1200 indicates the processing steps associated with the data packet headers of exemplary data packets, FIGS. 11A and 11B.

The process 1200 starts in step 1205. In step 1210, the process determines what the transport protocol is.

If, in step 1210, the transport protocol is determined to be TCP, then, in step 1215, the process 1200 gets the TCP port number from the TCP section 1110 (FIG. 11A). If, in step 1210, the process 1200 determines the transport protocol to be UDP, then, in step 1220, the process 1200 gets the UDP port number from the UDP section 1125 (FIG. 11B). If, in step 1210, the process 1200 determines that the transport protocol is neither TCP nor UDP, but rather some other transport protocol, such as a user-defined transport protocol, then, in step 1225, the process 1200 by-passes the processing steps associated with the known TCP and UDP transport protocols. It should be understood that the process 1200 can be expanded to include processing for the user-defined transport protocol.

Following step 1215 and step 1220, the process 1200 continues in step 1230, where the process 1200 determines whether the application type (e.g., HTTP or RTP) is known. If in step 1230, the process 1200 determines that the application type is not known, then the process 1200 ends in step 1260. If, in step 1230, the process 1200 determines that the application type is known, then processing continues in step 1235.

In step 1235, the process 1200 looks at the packet header for application-specific media type/object type information (e.g., HTTP, FTP, RTP, MP3, M3U). From this application-specific media type/object type information, the process 1200 is able to determine the media type contained in the data packet.

After determining the media type in step 1235, the process 1200 compares during step 1240 the media type to the entries in the stream association table 905 (FIG. 9) to determine if the HTTP webstream 900 (FIG. 9) already knows how to process the data in the data packet. If the process 1200 determines that the data packet does not belong to a stream in the HTTP webstream 900, then the process 1200 creates a new object entry in the stream association table 905 in step 1245. Processing continues in step 1250 to determine if the data type is compressible.

If the process 1200 determines in step 1250 that the data type is compressible, by accessing the compression disable table 635, then the process ends in step 1260. In this case, the state of the compressor state variable remains "enable", thereby allowing the compressor 615 (FIG. 6A) to operate as usual. If, however, the process 1220 determines in step 1250 that the data type is not compressible, again, by accessing the compression disable table 635, then, in step 1255, the process 1200 disables compression, which disables the compressor 615. The process 1200 ends in step 1260.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for optimizing compression efficiency comprising:
   receiving at a router-type device a data stream in which multiple streams of associated protocol data units are interposed;
   filtering protocol-specific header and control information of a protocol data unit (PDU) to determine compressibility of the contents of said protocol data unit including determining if a given protocol data unit from the data stream is associated with a previously filtered protocol data unit by tracking previously filtered protocol data units from the data stream and information regarding the compression applied to previously filtered protocol data units;
   based on the result of said filtering, selecting the state of data link compression for said protocol data unit to optimize compression efficiency such that if the given protocol data unit is associated with a previously filtered protocol data unit, the data link compression that was applied to the previously filtered protocol data unit is selected; and
   associating the selected state of data link compression with the given protocol data unit to control a compression process adapted to compress contents of protocol data units.

2. The method as claimed in claim 1, further including compressing the contents of the protocol data unit as a function of the state of data link compression.

3. The method as claimed in claim 2, wherein compressing the contents of the protocol data unit includes applying an indication in or with the compressed protocol data unit to indicate whether the contents of the protocol data unit have been compressed.

4. The method as claimed in claim 3, further including decompressing the compressed contents of the protocol data unit.

5. The method as claimed in claim 4, wherein, based on the indication of whether the contents of the protocol data unit have been compressed, decompressing the compressed contents of the protocol data unit is performed in a manner previously negotiated.

6. The method as claimed in claim 1, further including accessing a table having entries with specific media types deemed compression limited.

7. The method as claimed in claim 1, wherein filtering includes associating individual protocol data units to a specific media type.

8. The method as claimed in claim 1, wherein determining includes accessing a table including tracking information about previously filtered protocol data units.

9. The method as claimed in claim 1, wherein selecting the state of the data link compression includes disabling the data link compression if the compressibility of the contents of the protocol data unit is determined to be low.

10. The method as claimed in claim 1, wherein selecting the state of the data link compression includes enabling the data link compression if the compressibility of the contents of the protocol data unit is determined to be high.

11. The method as claimed in claim 1, further including initializing a table used by the data link compression with data patterns expected to be contained in the content of said protocol data unit.

12. The method of claim 1 wherein:
   the filtering protocol-specific header and control information of a protocol data unit (PDU) to determine compressibility of the contents of said protocol data unit includes determining the type of data of the given protocol data unit where the given protocol data unit is not associated with a previously filtered protocol data unit; and
   the selecting the state of data link compression for said protocol data unit to optimize compression efficiency is performed such that the state of data link compression is selected based on the determined type of data of the given protocol data unit if the given protocol data unit is not associated with a previously filtered protocol data unit.

13. An apparatus for optimizing compression efficiency comprising:
   a protocol data unit (PDU) filter configured to determine compressibility of the contents of a given protocol data unit from a data stream in which multiple streams of associated protocol data units are interposed by determining if the given protocol data unit is associated with a previously filtered protocol data unit from the data stream;
   a tracking unit operatively associated with the PDU filter configured to track previously filtered protocol data units to enable the PDU filter to determine if the given protocol data unit is associated with a previously filtered protocol data unit; and
   a selector coupled to the output of the filter and configured (i) to select the state of data link compression for the given protocol data unit to optimize compression efficiency such that if the given protocol data unit is associated with a previously filtered protocol data unit, the data link compression that was applied to the previously filtered protocol data unit is selected, and (ii) to associate the selected state of data link compression with the given protocol data unit to control a compressor adapted to compress contents of protocol data units.

14. The apparatus as claimed in claim 13, further including a compressor configured to compress the contents of the protocol data unit responsive to the state of data link compression.

15. The apparatus as claimed in claim 14, wherein the compressor is configured to include an indication in or with the compressed protocol data unit to indicate whether the contents of the protocol data unit have been compressed.

16. The apparatus as claimed in claim 15, further including a decompressor configured to decompress the compressed contents of the protocol data unit.

17. The apparatus as claimed in claim 16, wherein, the decompressor is configured to decompress the contents of the protocol data unit in a manner previously negotiated with the compressor based on the indication of whether the contents of the protocol data unit have been compressed.

18. The apparatus according to claim 13, wherein:
the filter is configured to determine compressibility of the contents of the given protocol data unit by determining the type of data of the given protocol data unit where the given protocol data unit is not associated with a previously filtered protocol data unit;
the selector is configured to select the state of data link compression for the given protocol data unit based on the determined type of data of the given protocol data unit if the given protocol data unit is not associated with a previously filtered protocol data unit; and
the selector includes a table configured to store entries with specific media types deemed compression limited.

19. The apparatus as claimed in claim 13, wherein the filter is configured to associate individual protocol data units to a specific media type.

20. The apparatus as claimed in claim 13, wherein the filter further includes a table configured to store information about previously filtered protocol data units.

21. The apparatus as claimed in claim 13, wherein the selector is configured to disable the compressor if the compressibility of the contents of the protocol data unit is determined to be low.

22. The apparatus as claimed in claim 13, wherein the selector is configured to enable the compressor if the compressibility of the contents of the protocol data unit is determined to be high.

23. The apparatus as claimed in claim 13, further including an initialization unit configured to initialize a table used by the compressor with data patterns expected to be contained in the content of said protocol data unit.

24. A computer-readable medium having stored thereon sequences of instructions, the sequences of instructions including instructions, when executed by a processor, configured to cause the processor to perform:
filtering protocol-specific header and control information of a protocol data unit from a data stream in which multiple streams of associated protocol data units are interposed to determine compressibility of the contents of said protocol data unit including:
determining if a given protocol data unit is associated with a previously filtered protocol data unit from the data stream by tracking previously filtered protocol data units and information regarding the compression applied to previously filtered protocol data units; and
determining the type of data of the given protocol data unit where the given protocol data unit is not associated with a previously filtered protocol data unit;
selecting the state of data link compression for said protocol data unit based on the results of said filtering to optimize compression efficiency such that:
if the given protocol data unit is associated with a previously filtered protocol data unit, the data link compression that was applied to the previously filtered protocol data unit is selected; and
otherwise the state of data link compression is selected based on the determined type of data of the given protocol data unit; and
associating the selected state of data link compression with the given protocol data unit to control a compression process adapted to compress contents of protocol data units.

* * * * *

UNITED STATES PATENT AND TRADEMARK OFFICE
CERTIFICATE OF CORRECTION

PATENT NO. : 7,640,362 B2  Page 1 of 1
APPLICATION NO. : 09/774545
DATED : December 29, 2009
INVENTOR(S) : Brooks et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1015 days.

Signed and Sealed this

Twenty-first Day of December, 2010

David J. Kappos
*Director of the United States Patent and Trademark Office*

UNITED STATES PATENT AND TRADEMARK OFFICE
CERTIFICATE OF CORRECTION

PATENT NO. : 7,640,362 B2  Page 1 of 1
APPLICATION NO. : 09/774545
DATED : December 29, 2009
INVENTOR(S) : Brooks et al.

It is certified that error appears in the above-identified patent and that said Letters Patent is hereby corrected as shown below:

IN THE SPECIFICATION

At column 7, line 23, after the first use of the word "packets", delete "$P_1$-$P_3$" and insert therefor -- $P_1$-$P_{13}$ --.

Signed and Sealed this
Fourth Day of October, 2011

David J. Kappos
*Director of the United States Patent and Trademark Office*